(12) United States Patent
Cich

(10) Patent No.: US 8,981,312 B1
(45) Date of Patent: Mar. 17, 2015

(54) PHOTON DETECTOR CONFIGURED TO EMPLOY THE GUNN EFFECT AND METHOD OF USE

(71) Applicant: Sandia Corporation, Albuquerque, NM (US)

(72) Inventor: Michael J. Cich, Fremont, CA (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 14/023,348

(22) Filed: Sep. 10, 2013

(51) Int. Cl.
*G01T 1/24* (2006.01)
*H01L 31/117* (2006.01)

(52) U.S. Cl.
CPC .................................. *H01L 31/117* (2013.01)
USPC .................................................... 250/370.12

(58) Field of Classification Search
USPC ........................................ 250/370.01–370.15
See application file for complete search history.

(56) References Cited

U.S. PATENT DOCUMENTS

| | | | | |
|---|---|---|---|---|
| 4,064,620 | A * | 12/1977 | Lee et al. | 438/122 |
| 4,894,689 | A * | 1/1990 | Cooper et al. | 257/8 |
| 5,675,157 | A * | 10/1997 | Battersby | 257/6 |
| 6,514,832 | B1 * | 2/2003 | Nakagawa et al. | 438/412 |
| 6,674,064 | B1 * | 1/2004 | Chernyak et al. | 250/214.1 |
| 2002/0185709 | A1 * | 12/2002 | Kimura et al. | 257/604 |
| 2006/0232347 | A1 * | 10/2006 | Newsome | 331/107 G |
| 2006/0267007 | A1 * | 11/2006 | Salzman et al. | 257/46 |
| 2007/0285942 | A1 * | 12/2007 | Yang et al. | 362/608 |
| 2009/0045346 | A1 * | 2/2009 | Von Kanel et al. | 250/370.09 |
| 2012/0049242 | A1 * | 3/2012 | Atanackovic et al. | 257/184 |

OTHER PUBLICATIONS

Knoll, Glenn F., *Radiation Detection and Measurement*, 4th ed., Ch. 13., pp. 471-512, (2010).
McGregor, D.S., et al. "Bulk GaAs room temperature radiation detectors", Nuclear Instruments and Methods in Physics Research A322 (1992) p. 487-492.
Dubecky, et al. "Performance of semi-insulating GaAs-based radiation detectors: Role of key physical parameters of base materials", Nuclear Instruments and Methods in Physics Research A576 (2007) p. 27-31.

\* cited by examiner

*Primary Examiner* — David J Makiya
*Assistant Examiner* — Taeho Jo
(74) *Attorney, Agent, or Firm* — Martin I. Finston

(57) ABSTRACT

Embodiments disclosed herein relate to photon detectors configured to employ the Gunn effect for detecting high-energy photons (e.g., x-rays and gamma rays) and methods of use. In an embodiment, a photon detector for detecting high-energy photons is disclosed. The photon detector includes a p-i-n semiconductor diode having a p-type semiconductor region, an n-type semiconductor region, and a compensated i-region disposed between the p-type semiconductor region and the n-type semiconductor region. The compensated i-region and has a width of about 100 μm to about 400 μm and is configured to exhibit the Gunn effect when the p-i-n semiconductor diode is forward biased a sufficient amount. The compensated i-region is doped to include a free carrier concentration of less than about $10^{10}$ cm$^{-3}$.

19 Claims, 4 Drawing Sheets

PHOTON DETECTOR CONFIGURED TO EMPLOY THE GUNN EFFECT AND METHOD OF USE

STATEMENT REGARDING GOVERNMENT RESEARCH AND DEVELOPMENT

This invention was made with Government support under government contract no. DE-AC04-94AL85000 awarded by the U.S. Department of Energy to Sandia Corporation. The Government has certain rights in the invention, including a paid-up license and the right, in limited circumstances, to require the owner of any patent issuing in this invention to license others on reasonable terms.

BACKGROUND

Photodiodes are used in a variety of applications for converting light into electrical signals. For example, photodiodes are employed in photo-detection applications, such as photo-detectors for detecting light and solar cells for converting solar radiation into electrical energy.

Germanium photon detectors have long been the standard for gamma detection and spectroscopy. Germanium photon detectors owe their performance to technology developed that allows purification of germanium to very low residual doping levels. This ability to achieve very low doping levels has not been matched in any other semiconductor material. In fact, it is unlikely that any other bulk semiconductor will ever surpass germanium in purity. Unfortunately, the relatively small bandgap of germanium means that the intrinsic carrier generation rate will create too much background signal for room temperature operation. In an attempt to solve this problem, relatively wider bandgap semiconductors have been used in photon detectors.

Gallium arsenide was recognized as early as the 1960s as an attractive alternative to germanium. For example, gallium arsenide has a similar atomic number to provide good stopping power in a reasonable volume, and is easily grown as large, high quality crystals up to 200 mm diameter. However, residual donors and acceptors have limited the background carrier concentration in large gallium arsenide crystals to no lower than $\sim 10^{14}$ cm$^{-3}$, corresponding to a maximum junction depletion width of ~300 µm at a reverse bias of 6000 V before avalanche breakdown. In practice, surface/edge breakdown tended to restrict the applied voltage and depletion width even further.

To overcome the unintentional doping problem, compensation of the residual acceptors or donors by deep levels was developed using either chromium or excess-arsenic doping. This allowed the routine production of semi-insulating gallium arsenide wafers with carrier concentrations in the range of $10^8$ cm$^{-3}$. Unfortunately, this did not correspond to large improvements in gallium arsenide breakdown voltage capabilities. When a reverse bias is applied to compensated material, the compensating impurities contribute to the junction space charge. Therefore, the electric field still cannot penetrate through a large volume of the semiconductor, and gamma detectors appear to have low efficiency. This low efficiency has been reported repeatedly in attempts to make gallium arsenide gamma detectors.

Therefore, there is still a need for improved photon detectors, such as gallium arsenide photon detectors for detecting high-energy photons.

SUMMARY

Embodiments disclosed herein relate to photon detectors for detecting high-energy photons (e.g., x-rays and gamma rays) that are configured to operate in a forward bias mode and employ the Gunn effect, and methods of use. In an embodiment, a photon detector for detecting high-energy photons is disclosed. The photon detector includes a p-i-n semiconductor diode having a p-type semiconductor region, an n-type semiconductor region, and a compensated i-region disposed between the p-type semiconductor region and the n-type semiconductor region. The photon detector further includes a voltage source, and a controller operably coupled to the voltage source and configured to direct the voltage source to apply a forward bias to the p-i-n semiconductor diode. For example, the compensated i-region may exhibit the Gunn effect while subjected to the forward bias.

In an embodiment, a photon detector for detecting high-energy photons is disclosed. The photon detector includes a p-i-n semiconductor diode having a p-type semiconductor region, an n-type semiconductor region, and a compensated i-region disposed between the p-type semiconductor region and the n-type semiconductor region. The compensated i-region has a width of about 100 µm to about 400 µm and is configured to exhibit the Gunn effect when the p-i-n semiconductor diode is forward biased a sufficient amount. The compensated i-region is doped to include a free carrier concentration of less than about $10^{10}$ cm$^{-3}$.

In an embodiment, a method for detecting high-energy photons is disclosed. The method includes forward biasing a p-i-n semiconductor diode of a photon detector. For example, the forward biasing may cause a compensated i-type semiconductor region of the p-i-n semiconductor diode to exhibit the Gunn effect while being forward biased. The method further includes while the p-i-n semiconductor diode is forward biased, receiving the high-energy photons at a drift region of the p-i-n semiconductor diode of the photon detector to generate a photoresponse in the photon detector. The method additionally includes determining the presence of the high-energy photons at least partially based on the photoresponse of the photon detector.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments, wherein identical reference numerals refer to identical or similar elements or features in different views or embodiments shown in the drawings.

DETAILED DESCRIPTION

Figure 1:
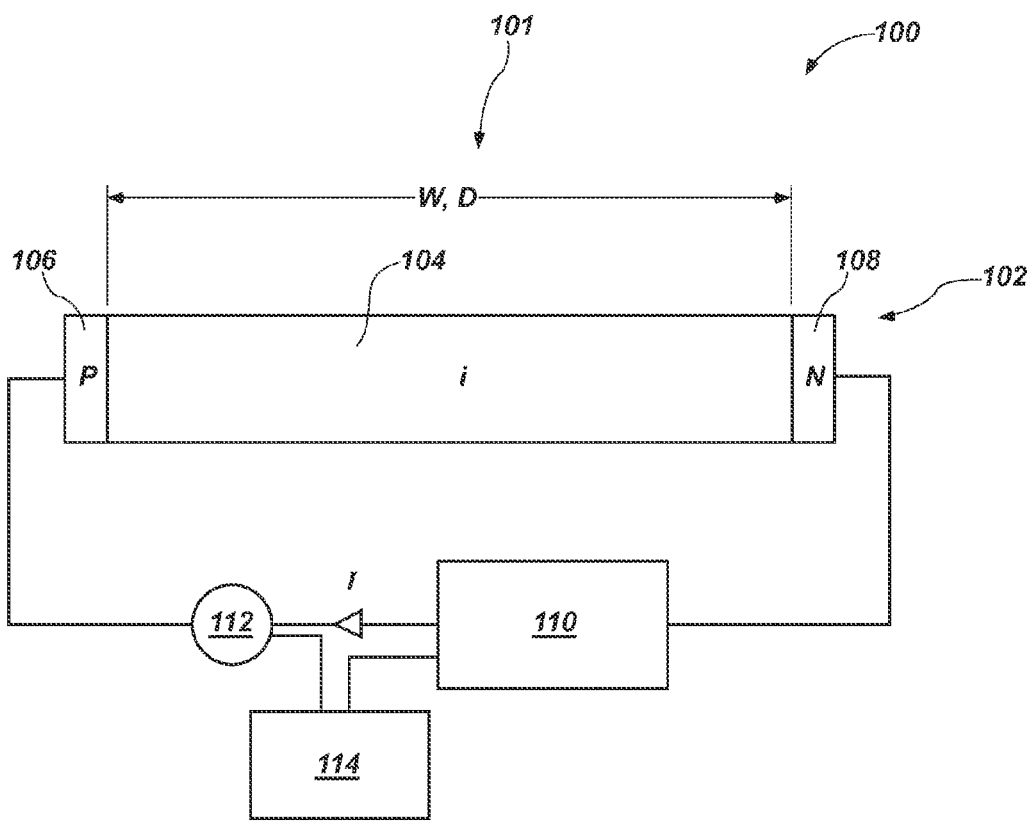
FIG. 1 is a side view of a photon detector including a p-i-n semiconductor diode having a compensated i-region according to an embodiment.

Embodiments disclosed herein relate to photon detectors for detecting high-energy photons (e.g., x-rays and gamma rays) that are configured to operate in a forward bias mode and employ the Gunn effect, and methods of use. FIG. 1 illustrates a photon detector 100 configured for detecting photons 101 according to an embodiment. The photon detector 100 includes a p-i-n semiconductor diode 102, which includes a compensated i-region 104 configured to exhibit the Gunn effect disposed between a p-type semiconductor region 106 and a n-type semiconductor region 108. In the Gunn effect, a sufficiently strong electrical voltage may force some of electrons into a state of lower mobility that causes them to move more slowly and decreasing an electrical conductivity of the compensated i-region 104/increases the resistivity of the compensated i-region 104. In the illustrated embodiment, the p-type semiconductor region 106 and the n-type semiconductor region 108 are each laterally adjacent to the compensated i-region 104.

The compensated i-region 104 is doped to exhibit a free carrier concentration of less than about $10^{10}$ cm$^{-3}$, less than about $10^9$ cm$^{-3}$, less than about $10^8$ cm$^{-3}$, less than about $10^7$ cm$^{-3}$, or about $10^5$ cm$^{-3}$ to about $10^7$ cm$^{-3}$ such that the compensated i-region 104 exhibits a relatively high resistivity compared to an intrinsic semiconductor, such as intrinsic gallium arsenide. The doping for compensation is to counter residual acceptor impurities that are present in even the most pure intrinsic semiconductors. For example, when the p-i-n semiconductor diode is made from gallium arsenide, the compensated i-region 104 may be doped with arsenic at a concentration of about $10^{13}$ cm$^{-3}$ to about $10^{17}$ cm$^{-3}$ to compensate for residual acceptor impurities. The compensated i-region 104 is relatively wide compared to the p-type semiconductor region 106 and n-type semiconductor region 108. For example, the compensated i-region 104 exhibits a width "w" of about 100 µm to about 400 µm, about 100 µm to about 300 µm, about 250 µm to about 350 µm, or about 250 µm, while the p-type semiconductor region 106 and n-type semiconductor region 108 may exhibit respective widths of about 1 µm to about 5 µm.

The photon detector 100 further includes a voltage source 110 that is electrically coupled to the p-type semiconductor region 106 and the n-type semiconductor region 108 via respective electrical contacts (not shown). A current sensor 112 (e.g., an ammeter) is coupled between the p-type semiconductor region 106 and the n-type semiconductor region 108 to measure current "I" passing through the p-i-n semiconductor diode 102. A controller 114 is operably coupled to the voltage source 110 to control the operation thereof and coupled to the current sensor 112 to receive the measured current therefrom. The controller 114 may be configured to or programmed to direct the voltage source 110 to apply a forward bias to the p-i-n semiconductor diode 102 sufficient to generate the Gunn effect in the compensated i-region 104. For example, the controller 114 may include software having computer executable instructions, firmware, or hardware such as programmable logic circuits that directs the voltage source 110 to apply the forward bias to the p-i-n semiconductor diode 102 sufficient to generate the Gunn effect in the compensated i-region 104.

In an embodiment, the p-i-n semiconductor diode 102 may comprise gallium arsenide. For example, the p-type semiconductor region 106 may comprise p-type GaAs, the n-type semiconductor region 108 may comprise n-type GaAs, and the compensated i-region 104 may comprise compensated GaAs doped with about $10^{15}$ cm$^{-3}$ to about $10^{16}$ cm$^{-3}$ EL2 deep donors that compensate approximately $10^{15}$ cm$^{-3}$-residual acceptors. For example, suitable p-type dopants for forming the p-type GaAs include beryllium, magnesium, carbon, zinc, cadmium, or combinations thereof. For example, suitable n-type dopants for forming the n-type GaAs include sulfur, selenium, tellurium, silicon, germanium, or combinations thereof. It should be noted that other types of III-V semiconductor compounds may be used for the p-i-n semiconductor diode 102 or any other embodiment disclosed herein.

Figure 2:
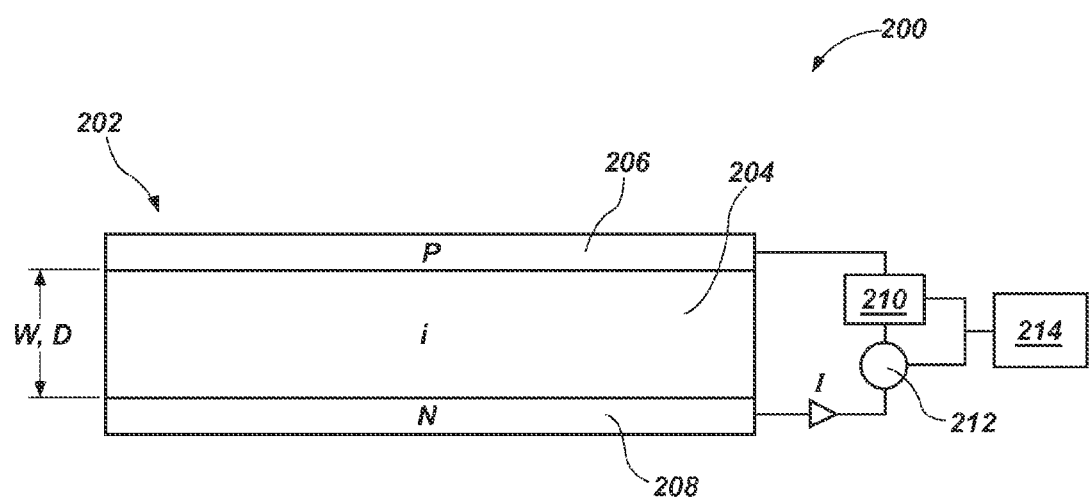
FIG. 2 is a side view of a photon detector including a p-i-n semiconductor diode having a compensated i-region according to another embodiment.

FIG. 2 illustrates a photon detector 200 according to another embodiment. The photon detector 200 is similar to the photon detector 100 shown in FIG. 1 except that the compensated i-region configured to exhibit the Gunn effect is sandwiched between a p-type semiconductor region and a n-type semiconductor region. For example, such a structure may be formed by doping opposite sides of a compensated GaAs wafer.

The photon detector 200 includes a p-i-n semiconductor diode 202, which includes a compensated i-region 204 configured to exhibit the Gunn effect disposed between a p-type semiconductor region 206 and a n-type semiconductor region 208. The photon detector 200 further includes a voltage source 210 that is electrically coupled to the p-type semiconductor region 206 and the n-type semiconductor region 208 via respective electrical contacts (not shown). A current sensor 212 (e.g., an ammeter) is coupled between the p-type semiconductor region 206 and the n-type semiconductor region 208 to measure current "I" passing through the p-i-n semiconductor diode 202. A controller 214 is operably coupled to the voltage source 210 to control the operation thereof and coupled to the current sensor 212 to receive the measured current therefrom. The controller 214 may be configured to or programmed to direct the voltage source 210 to apply a forward bias to the p-i-n semiconductor diode 202 sufficient to generate the Gunn effect in the compensated i-region 204. For example, the controller 214 may include software having computer executable instructions, firmware, or hardware such as programmable logic circuits that directs the voltage source 210 to apply the forward bias to the p-i-n semiconductor diode 202 sufficient to generate the Gunn effect in the compensated i-region 104.

The p-i-n semiconductor diode 202 may be made from the same materials as the p-i-n semiconductor diode 102 and the same thickness regions, and in the interest of brevity such features are not repeated herein. For example, the compensated i-region 204 may exhibit a width "w" of about 100 µm to about 400 µm, about 100 µm to about 300 µm, about 250 µm to about 350 µm, or about 250 µm, while the p-type semiconductor region 206 and n-type semiconductor region 208 may exhibit respective widths of about 1 µm to about 5 µm.

Figure 3:
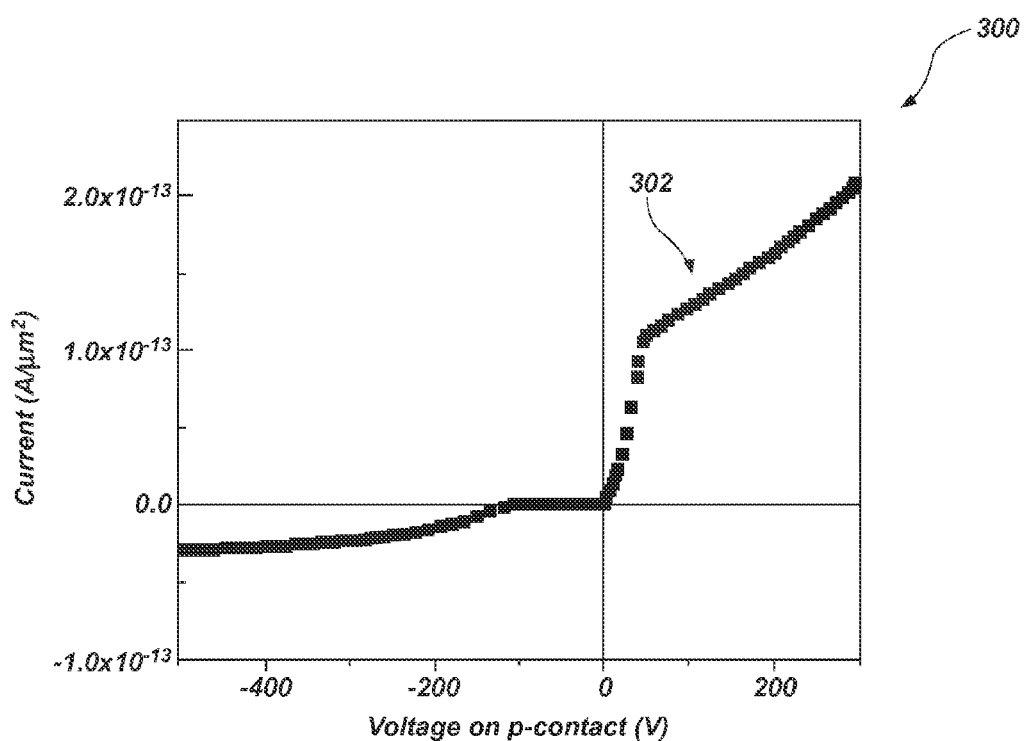
FIG. 3 is an example of a current-voltage curve for the photon detectors of FIGS. 1 and 2.

FIG. 3 is an example of the calculated current-voltage curve 300 of the p-i-n semiconductor diode 102, 202 of the photon detector 100, 200 shown in FIGS. 1 and 2. In the calculation, the p-i-n semiconductor diode was a GaAs p-i-n semiconductor diode that had 1 µm n-type GaAs on the left edge and 1 µm p-type GaAs on the right edge, while the center 250 µm is doped with $10^{15}$ cm$^{-3}$ shallow residual acceptors compensated by $10^{16}$ cm$^{-3}$ EL2 deep donors.

Unlike a conventional p-i-n semiconductor diode, the wide compensated i-region 104, 204 provides the surprising current-voltage curve 300 when the p-i-n semiconductor diode 102, 202 is forward biased a sufficient extent. As shown in FIG. 3, when the p-i-n semiconductor diode 102, 202 is forward biased by the voltage source 110, 210 a sufficient, a roll-over region 302 in the current-voltage curve 300 is observed when the electric field is sufficient for negative-differential-mobility-induced space charge regions to be generated in the compensated i-region 104, 204 of the p-i-n semiconductor diode 102, 202. This provides a sufficiently low background current for high-energy photon detection, with a relatively wide drift region "D" generated in the p-i-n semiconductor diode 102, 202 under forward bias that may extend over substantially all of the p-i-n semiconductor diode 102, 202. For example, under forward bias in the roll-over region 302, the drift region "D" of the p-i-n semiconductor diode 102, 202 may be coextensive in width with the width "W" of the compensated i-region 104, 204 or greater (e.g., extending into the p-type semiconductor and n-type semiconductor regions). For example, in some embodiments, the drift region "D" may be about 150 µm to about 450 µm, about 150 µm to about 300 µm, or about 350 µm to about 450 µm depending on the applied forward bias, doping levels, and materials.

Figure 4:
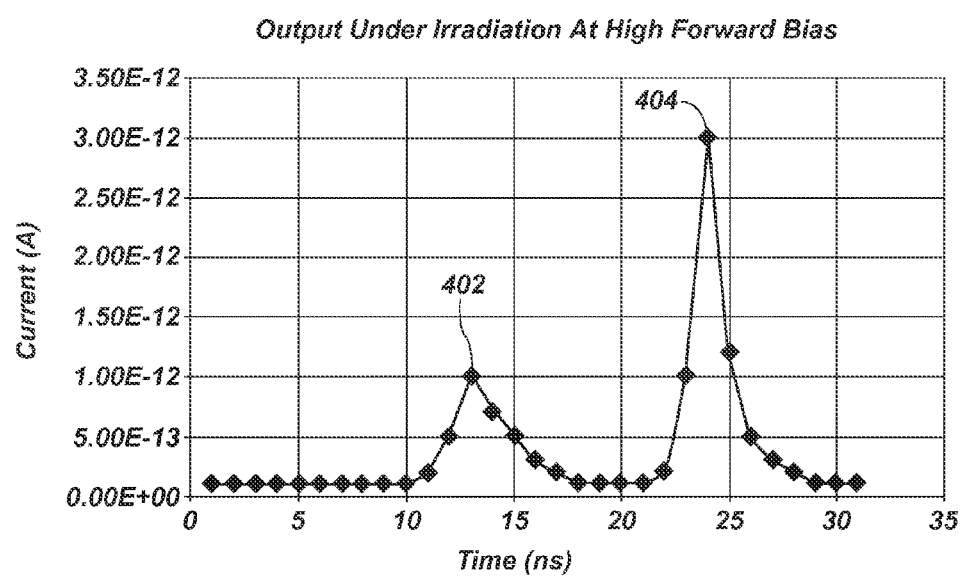
FIG. 4 is an example of the current-time output characteristics after receiving photons at the photon detectors of FIGS. 1 and 2 when the photon detector is forward biased.

FIG. 4 is an example of current-time output characteristics after receiving photons at the photon detectors of FIGS. 1 and 2 when the photon detector is forward biased to the roll-over region 302 shown in FIG. 3. In operation, the controller 114, 214 directs the voltage source 110, 210 to forward bias the p-i-n semiconductor diode 102, 202 of the photon detector 100, 200 to a sufficient amount until the compensated i-region 104, 204 exhibits the Gunn effect due the electric field being sufficient for negative-differential-mobility-induced space charge regions to be generated. The drift region "D" of the p-i-n semiconductor diode 102, 202 of the photon detector 100, 200 receives fluxes of photons at different times, which generate photogenerated electron-hole pairs in the drift region "D." Each discrete current spike 402 and 404 represents receipt of a high-energy photon, such as an x-ray or a gamma ray. For example, in operation, the controller 114, 214 receives the current "I" and may be configured to analyze the data to generate the current-time relationship shown in FIG. 4, which may be displayed on a graphical display such as a monitor (not shown).

Because the forward biasing is to such an extent that the compensated i-region 104, 204 exhibits the Gunn effect, the current values are relatively small in the forward bias region due to the relatively high resistance. This means that under such forward biasing conditions, there is a low background current that allows for better photon detector sensitivity and resolution of high-energy photons as indicated by the discrete current spikes 402 and 404. Each of the discrete current spikes 402 and 404 is associated with the arrival of a high-energy photon. The area under a current spike is associated with the received photon energy. Thus, both the flux (events/time) as well as the energy distribution of events is generated from the current versus time curve shown in FIG. 4. For example, the controller 114, 214 may be configured to or programmed to calculate the received photon energy for respective photons, which may be displayed on a graphical display such as a monitor (not shown).

Figure 5:
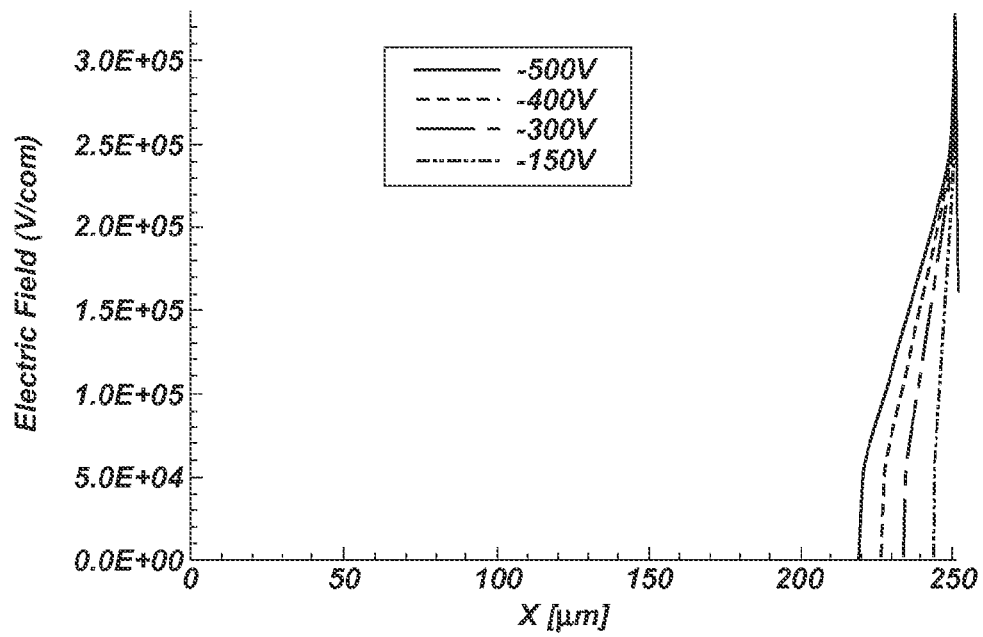
FIG. 5 is a graph of the electric field distribution in a compensated gallium arsenide p-i-n semiconductor diode under reverse bias.

FIG. 5 is the electric field distribution in a compensated GaAs p-i-n semiconductor diode under reverse bias. The GaAs p-i-n semiconductor diode used in this calculation had 1 µm n-GaAs on the left edge and 1 µm p-GaAs on the right edge, while the center 250 µm is doped with $10^{15}$ cm$^{-3}$ shallow residual acceptors compensated by $10^{16}$ cm$^{-3}$ EL2 deep donors. The p-contact is biased at −500 V, −400 V, −300 V, and −150 V relative to the n-contact. The drift region only reaches just over 30 µm before avalanche breakdown begins, due to the high field at the p-I junction.

Figure 6:
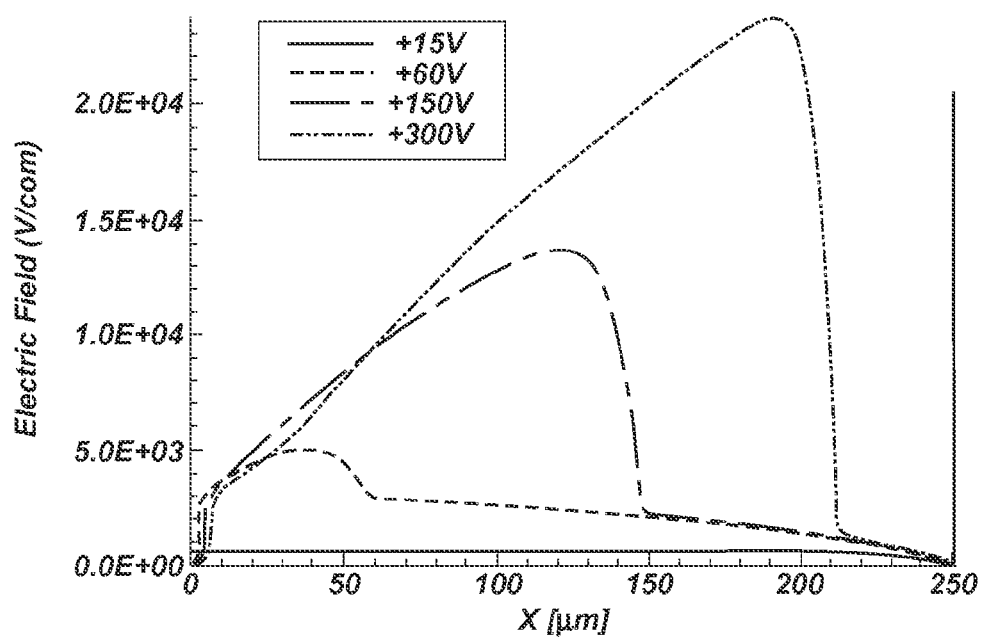
FIG. 6 is a graph of the electric field distribution in the same compensated gallium arsenide p-i-n semiconductor diode used in the calculation for the electric field distribution of FIG. 5 under forward bias according to an embodiment.

FIG. 6 is the electric field distribution in the same compensated GaAs p-i-n semiconductor diode used in the calculation for the electric field distribution of FIG. 5 under forward bias according to an embodiment. The applied voltages in this calculation were 15 V, 60 V, 150 V, and 300 V for the p-contact relative to the n-contact. The right edge of the hump in the electric field corresponds to positive space charge stored on the EL2 deep level due to a local depletion of electrons. This depletion results from an increase in carrier velocity as the electric field decreases. At the left edge of the device there is a negative space charge corresponding to the pileup of electrons as the field passes the critical electric field for the peak electron velocity. Note that the peak electric field in FIG. 6 under forward bias is about 10 times smaller compared to the reverse bias case shown in FIG. 5, and the electric field/drift region covers over 200 µm of material for 300 V bias. Thus, under forward bias conditions, the inventive p-i-n semiconductor diodes disclosed herein may be used as highly sensitive photon detectors that provides a larger volume detection area compared to conventional photon detectors.

Figure 7:
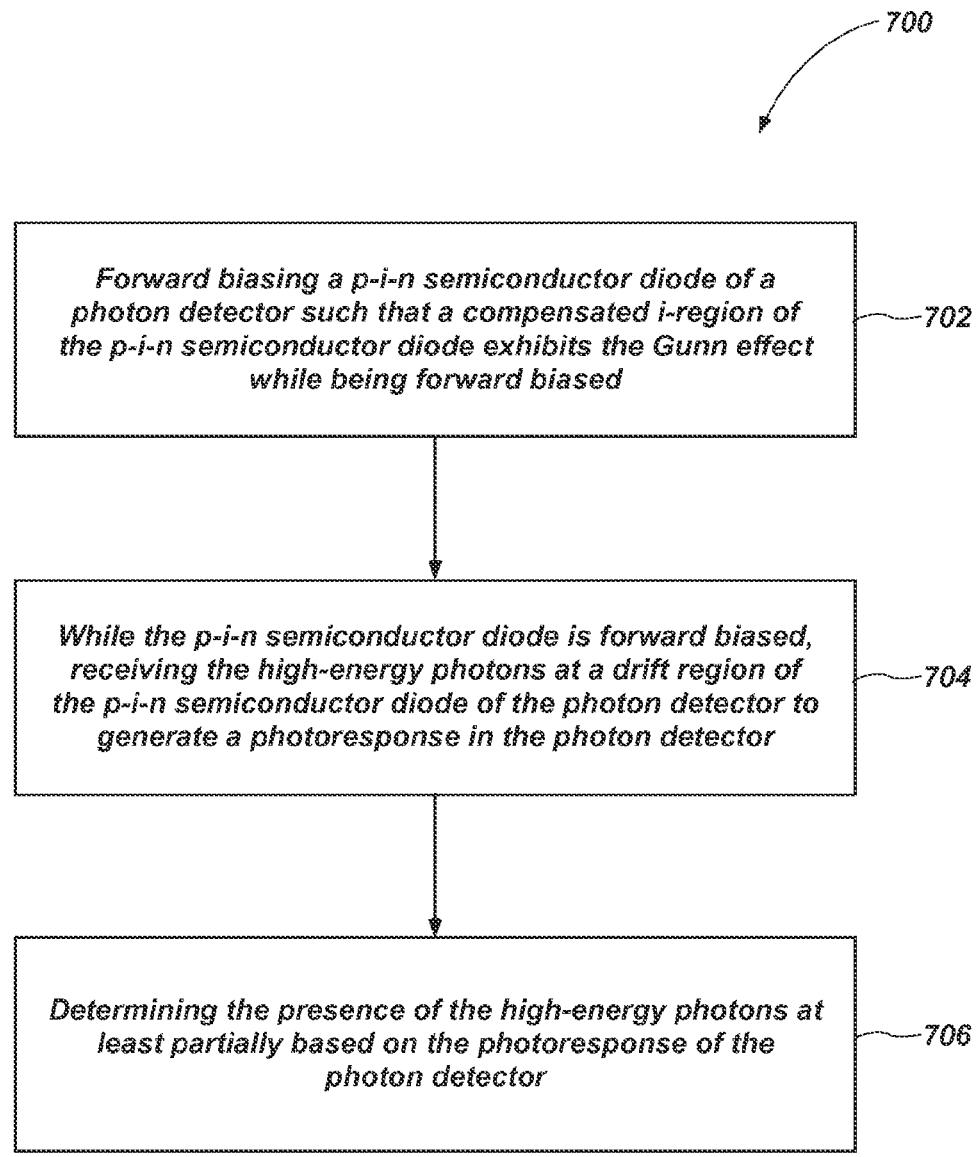
FIG. 7 is a flow diagram of a method of detecting photons according to an embodiment.

FIG. 7 is a flow diagram of a method 700 of detecting high energy photons according to an embodiment. The method 700 may be practiced using any of the photon detectors disclosed herein. The method 700 includes an act 702 of forward biasing a p-i-n semiconductor diode of a photon detector such that a compensated i-region of the p-i-n semiconductor diode exhibits the Gunn effect while being forward biased. The method 700 further includes an act 704 of while the p-i-n semiconductor diode is forward biased, receiving the high-energy photons at a drift region of the p-i-n semiconductor diode of the photon detector to generate a photoresponse in the photon detector. For example, the high-energy photons are typically received at a rate of 1 photon per millisecond or less. The method 700 additionally includes an act 706 of determining the presence of the high-energy photons at least partially based on the photoresponse of the photon detector. For example, the determining may be accomplished by analyzing the current versus time plot (e.g., shown in FIG. 4) for the presence of current spikes (e.g., the current spikes 402 and 404).

While various aspects and embodiments have been disclosed herein, other aspects and embodiments are contemplated. The various aspects and embodiments disclosed herein are for purposes of illustration and are not intended to be limiting.

The invention claimed is:

1. A photon detector for detecting high-energy photons, the photon detector comprising:
   a p-i-n semiconductor diode including:
      a p-type semiconductor region;
      an n-type semiconductor region; and
      a compensated i-region disposed between the p-type semiconductor region and the n-type semiconductor region;
   wherein the compensated i-region has a width of about 100 µm to about 400 µm;
   wherein the compensated i-region is configured to exhibit the Gunn effect when the p-i-n semiconductor diode is forward biased a sufficient amount; and
   wherein the compensated i-region is doped to include a free carrier concentration of less than about $10^{10}$ cm$^{-3}$.

2. The photon detector of claim 1 wherein the free carrier concentration of the compensated i-region is less than about $10^8 \text{ cm}^{-3}$.

3. The photon detector of claim 1 wherein the width of the compensated i-region is about 100 μm to about 300 μm.

4. The photon detector of claim 1 wherein the width of the compensated i-region is about 250 μm to about 350 μm.

5. The photon detector of claim 1 wherein a drift region is formed in the p-i-n semiconductor diode when the p-i-n semiconductor diode is forward biased that has a width of about 150 μm to about 300 μm.

6. The photon detector of claim 1 wherein the p-type semiconductor region and the n-type semiconductor region are laterally adjacent to the compensated i-region.

7. The photon detector of claim 1 wherein the compensated i-region is sandwiched between the p-type semiconductor region and the n-type semiconductor region.

8. The photon detector of claim 1, further comprising:
a voltage source; and
a controller operably coupled to the voltage source and configured to direct the voltage source to apply a forward bias to the p-i-n semiconductor diode such that the compensated i-region exhibits the Gunn effect while subjected to the forward bias.

9. The photon detector of claim 1, further comprising:
a voltage source; and
a controller operably coupled to the voltage source and programmed to direct the voltage source to apply a forward bias to the p-i-n semiconductor diode such that the compensated i-region exhibits the Gunn effect while subjected to the forward bias.

10. The photon detector of claim 1 wherein each of the p-type semiconductor region, the n-type semiconductor region, and the compensated i-region includes a III-V semiconductor compound.

11. The photon detector of claim 10 wherein the III-V semiconductor compound includes gallium arsenide.

12. The photon detector of claim 1:
wherein each of the p-type semiconductor region, the n-type semiconductor region, and the compensated i-region includes gallium arsenide;
wherein the free carrier concentration of the compensated i-region is less than about $10^7 \text{ cm}^{-3}$; and
wherein the p-i-n semiconductor diode exhibits a drift region having a width of about 150 μm to about 300 μm when the p-i-n semiconductor diode is forward biased.

13. The method of claim 12 wherein the high-energy photons includes at least one of x-rays or gamma rays.

14. The method of claim 12 wherein the drift region has a width of about 150 μm to about 300 μm when being forward biased.

15. The method of claim 12 wherein the p-i-n semiconductor diode includes a compensated i-region having a free carrier concentration of less than about $10^7 \text{ cm}^{-3}$.

16. The method of claim 12 wherein the p-i-n semiconductor diode includes a III-V semiconductor compound.

17. The method of claim 16 wherein the III-V semiconductor compound includes gallium arsenide.

18. A method for detecting high-energy photons, the method comprising:
forward biasing a p-i-n semiconductor diode of a photon detector such that a compensated i-region of the p-i-n semiconductor diode exhibits the Gunn effect while being forward biased;
while the p-i-n semiconductor diode is forward biased, receiving the high-energy photons at a drift region of the p-i-n semiconductor diode of the photon detector to generate a photoresponse in the photon detector; and
determining the presence of the high-energy photons at least partially based on the photoresponse of the photon detector.

19. A photon detector for detecting high-energy photons, the photon detector comprising a p-i-n semiconductor diode, a voltage source, and a controller, wherein:
the p-i-n semiconductor diode includes a p-type semiconductor region, an n-type semiconductor region, and a compensated i-semiconductor region disposed between the p-type semiconductor region and the n-type semiconductor region;
the controller is operably coupled to the voltage source and configured to direct the voltage source to apply a forward bias to the p-i-n semiconductor diode; and
the compensated i-semiconductor region exhibits the Gunn effect while subjected to the forward bias.

* * * * *